(12) United States Patent
Shaddock et al.

(10) Patent No.: US 10,698,027 B1
(45) Date of Patent: Jun. 30, 2020

(54) BLENDED ANALOG-TO-DIGITAL CONVERSION FOR DIGITAL TEST AND MEASUREMENT DEVICES

(71) Applicant: Liquid Instruments Pty Ltd., Lyneham, ACT (AU)

(72) Inventors: Daniel Anthony Shaddock, Kaleen (AU); Danielle Marie Rawles Wuchenich, Woodside, CA (US); Paul Anthony Altin, O'Connor (AU); Timothy Tien-Yue Lam, Crace (AU); Max Andrew Gordon Schwenke, Crace (AU); Benjamin Paul Coughlan, Braddon (AU); David Sebastiaan Rabeling, Bruce (AU)

(73) Assignee: Liquid Instruments Pty Ltd. (AU)

( * ) Notice: Subject to any disclaimer, the term of this patent is extended or adjusted under 35 U.S.C. 154(b) by 0 days.

(21) Appl. No.: 16/685,157

(22) Filed: Nov. 15, 2019

(51) Int. Cl.
  *H03M 1/10*   (2006.01)
  *G01R 31/3167*   (2006.01)
  *H03M 1/12*   (2006.01)

(52) U.S. Cl.
  CPC ...... *G01R 31/3167* (2013.01); *H03M 1/1071* (2013.01); *H03M 1/12* (2013.01)

(58) Field of Classification Search
  CPC .... G01R 31/3167; H03M 1/1071; H03M 1/12
  USPC ........................................ 341/118–120, 155
  See application file for complete search history.

(56) References Cited

U.S. PATENT DOCUMENTS

| | | | | |
|---|---|---|---|---|
| 7,428,464 B2* | 9/2008 | Nara | ................... | G01R 35/005 702/72 |
| 8,917,198 B2* | 12/2014 | Pagnanelli | ............ | H03M 3/468 341/118 |
| 9,007,251 B2* | 4/2015 | Perthold | ................ | G01R 23/16 341/118 |
| 9,112,524 B2* | 8/2015 | Snelgrove | ............... | H03M 1/12 |
| 9,414,156 B2* | 8/2016 | Bithell | ................... | H04R 3/002 |
| 9,813,267 B1* | 11/2017 | Barghi | ................ | H04L 27/2626 |

* cited by examiner

*Primary Examiner* — Jean B Jeanglaude
(74) *Attorney, Agent, or Firm* — Innovators Legal

(57) ABSTRACT

Systems and methods are provided for blended analog-to-digital conversion for digital test and measurement devices. A first-frequency-domain circuit path is configured to generate a first processed digital signal having high fidelity to an analog signal over a first frequency domain. A second-frequency-domain circuit path is configured to generate a second processed digital signal having high fidelity to the analog signal over a second frequency domain. A blended digital signal is generated using the first processed digital signal and the second processed digital signal. The blended digital signal can have high fidelity to the analog signal over multiple frequency domains.

20 Claims, 2 Drawing Sheets

BLENDED ANALOG-TO-DIGITAL CONVERSION FOR DIGITAL TEST AND MEASUREMENT DEVICES

BACKGROUND

Electronic test and measurement equipment can create signals and capture signal responses from electronic devices under test. Digital test and measurement devices can process signals to provide a variety of functionalities. However, where the processing is performed digitally, each functionality can be limited by the performance of the analog-to-digital converter (ADC) used to digitize the analog signal. It can be difficult for a single ADC to address all performance requirements of the various functionalities that can be performed by the digital test and measurement device.

BRIEF DESCRIPTION OF THE DRAWINGS

Many aspects of the present disclosure are better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

Figure 1:
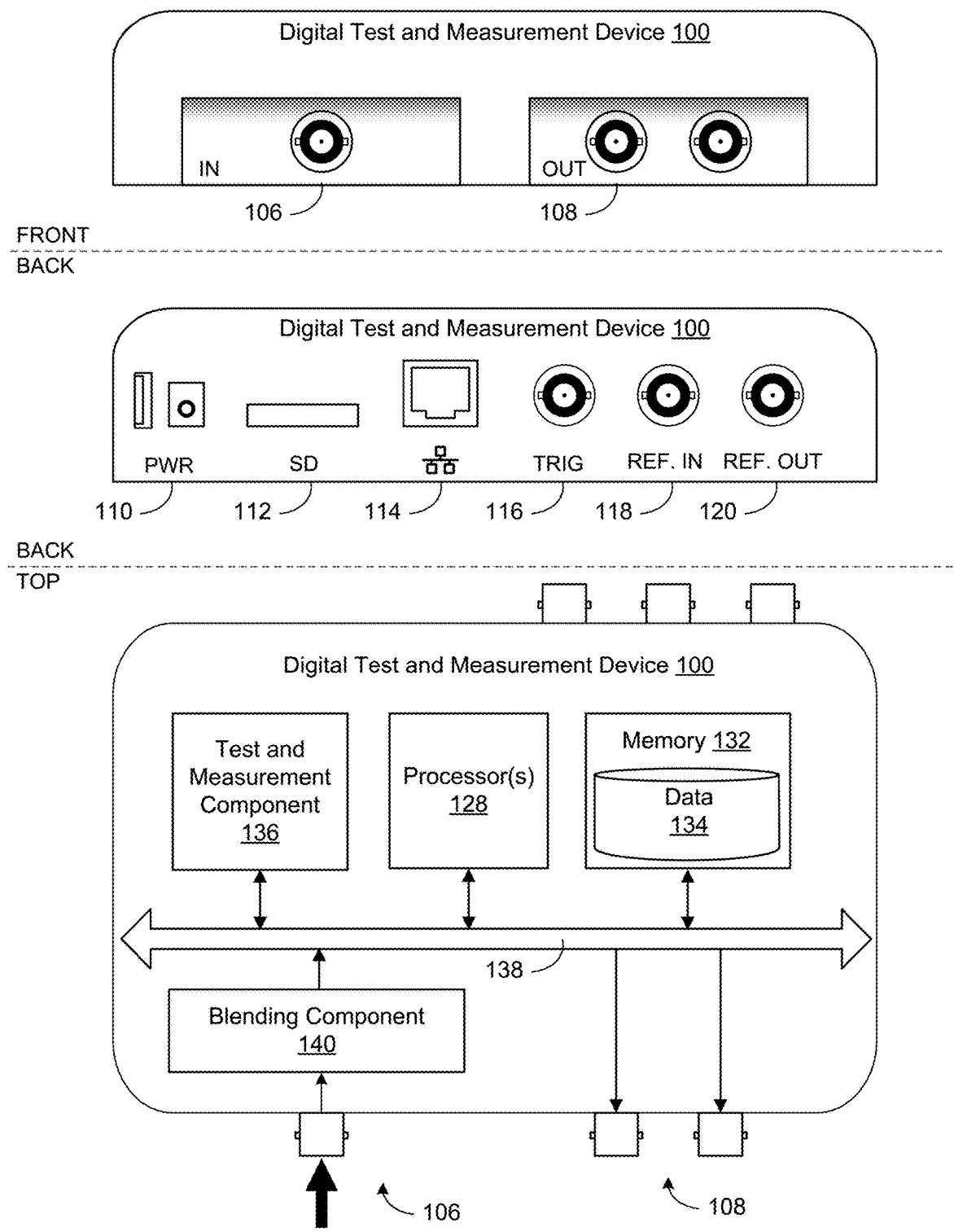
FIG. 1 is a drawing that illustrates an example digital test and measurement device with blended analog-to-digital conversion, according to various embodiments of the present disclosure.

The present disclosure relates to systems and methods for blended analog-to-digital conversion for digital test and measurement devices. Digital test and measurement devices can process signals to perform functionalities of many different stand-alone instruments. However, each functionality can be limited by the quality of the analog-to-digital conversion used to digitize the analog signal. The present disclosure describes mechanisms that can optimize analog-to-digital conversion by blending digitized signals from multiple analog-to-digital converters.

Some aspects of the present disclosure describe a reconfigurable test and measurement device for generating a blended digital signal from an analog signal. The blended digital signal can have high fidelity to the analog signal over multiple frequency domains. The test and measurement device can include a plurality of circuit paths for respective frequency domains.

For example, the reconfigurable test and measurement device can include a first-frequency-domain circuit path and a second-frequency-domain circuit path. The analog signal can be input into the first-frequency-domain circuit path to generate a first processed digital signal that has high fidelity to the analog signal over a first frequency domain. The first-frequency-domain circuit path can include a first analog-to-digital converter (ADC) that converts the analog signal into a first digital signal, and a first digital filter circuit that outputs a first filtered digital signal based on the first digital signal. The first-frequency-domain circuit path can output the first processed digital signal based on the first filtered digital signal.

The reconfigurable test and measurement device can also include a second-frequency-domain circuit path. The analog signal can be input into the second-frequency-domain circuit path to generate a second processed digital signal having high fidelity to the analog signal over a second frequency domain different from the first frequency domain. For example, the first frequency domain can include a high frequency domain with a range of high frequencies, while the second frequency domain can include a low frequency domain with a range of low frequencies. In some cases, the range of high frequencies can simply refer to a range of frequencies that are higher than those of the range of low frequencies.

The second-frequency-domain circuit path can include a second ADC that converts the analog signal into a second digital signal, and a second digital filter circuit that outputs a second filtered digital signal based on the second digital signal. In some embodiments, a sampling rate of the first ADC matches a sampling rate of the second ADC. In other cases, the sampling rates can differ. The second-frequency-domain circuit path can output the second processed digital signal based at least in part on the second filtered digital signal. A digital adder circuit can add the processed digital signal and the second processed digital signal to generate the blended digital signal.

In some embodiments, the first-frequency-domain circuit path can also include a digital subtractor circuit that subtracts the first filtered digital signal from the first digital signal to generate the first processed digital signal.

In some embodiments, the first digital filter circuit and the second digital filter circuit include matching digital low pass filters. In addition, the first ADC can be configured for high-frequency fidelity and the second ADC can be configured for low-frequency fidelity. Alternatively, the first digital filter circuit and the second digital filter circuit can include matching digital high pass filters, and the first ADC can be configured for low-frequency fidelity and the second ADC can be configured for high-frequency fidelity.

In some embodiments, the first digital filter and the second digital filter can be configured to include a matching cutoff frequency. Also, the first digital filter and the second digital filter can be configured to include a matching roll off rate.

In some embodiments, the reconfigurable test and measurement device includes a field-programmable gate array (FPGA) circuit that processes the blended digital signal to provide at least one functionality. For example, the functionality can be associated with a type of test and measurement instrument such as an oscilloscope functionality, spectrum analyzer, waveform generator, data logger, arbitrary waveform generator, FIR filter builder, PID controller, laser lock box, lock-in amplifier, frequency response analyzer, phasemeter, or digital filter box functionality. The reconfigurable test and measurement device can transmit an output from any of these functionalities to a display device or a computing device to generate the at least one visualization based on the blended digital signal.

Moving now to the figures, FIG. 1 shows a digital test and measurement device 100. The digital test and measurement device 100 can be reconfigurable or reprogrammable to update one of the functionalities provided, or to provide additional new functionalities. The digital test and measurement device 100 can include one or more analog inputs 106 or analog input channel. The digital test and measurement device 100 can include one or more output channels 108 such as an analog output channel. Analog output channels can be converted from digitally processed functionalities using a digital-to-analog converter (DAC). The analog inputs 106 and the outputs 108 can include BNC quick connectors, other coaxial connectors, or other appropriate connectors for analog connections.

The digital test and measurement device 100 can include one or more power inputs 110. For example, a Universal Serial Bus (USB) power input 110 or another standard for power inputs 110 such as DC power inputs 110 or AC power inputs 110. A USB input 110 can be used for power, but can also provide data and/or network connectivity to the digital test and measurement device 100. In some embodiments, the digital test and measurement device 100 can include AC to DC converter circuitry. The digital test and measurement device 100 can include a digital media port 112 such as an SD card port, microSD card port or another type of port for another type of memory card or storage device. The digital test and measurement device 100 can process an input to provide any of the functionalities described, and can store an output based on any of these functionalities directly to the storage device for later use.

The digital test and measurement device 100 can include a network port 114. The network port 114 can include an Ethernet port, for example, an RJ-45 port or another type of network port. The network port 114 can provide input and output to a networked client device such as a phone device, a tablet device, another handheld computing device, or any computing device. This can enable real time functionality switching and measurement readout. Control inputs can be received through a user interface of a suite of control software such as Python, LabVIEW™, and MATLAB®, among others. The digital test and measurement device 100 can process an input to provide any of the functionalities described and display them on a computing device through the network port 114. The digital test and measurement device 100 can also include a wireless communication device capable of providing the same functionalities and receiving control inputs through wireless network communications that utilize Wi-Fi, Bluetooth, and other wireless communications protocols.

The digital test and measurement device 100 can also include a trigger input 116, a reference input 118, and a reference output 120. The trigger input can provide for external triggering. The reference input 118 can include a 10 MHz reference input. The reference output 120 can include a 10 MHz reference output.

The digital test and measurement device 100 can also include computing capability through at least one processing system, for example, having a processor 128 and a memory 132, both of which are electrically and communicatively coupled to a local interface 138. The local interface 138 can be embodied as a data bus with an accompanying address/control bus or other addressing, control, and/or command lines, for data communications and addressing between the processor 128, the memory 132, and the test and measurement component 136. The test and measurement component 136 can be provided as a distinct hardware component and/or as instructions stored in the memory 132 and executed by the processor 128.

The digital test and measurement device 100 can include a blending component 140. The blending component 140 can optimize analog-to-digital conversion by blending digitized signals from multiple analog-to-digital converters. The blending component 140 can generate a blended digital signal based on an analog signal input, and provide the blended digital signal to the test and measurement component 136, which further processes this digital signal to provide instrument-based functionalities such as an oscilloscope functionality, spectrum analyzer, waveform generator, data logger, arbitrary waveform generator, FIR filter builder, PID controller, laser lock box, lock-in amplifier, frequency response analyzer, phasemeter, or digital filter box functionality. By utilizing the blending component 140 to perform the analog-to-digital conversion, the digital test and measurement device 100 can provide high fidelity analyses over all frequencies, without losing fidelity of high or low frequencies. The blending component 140 is discussed in further detail with respect to FIGS. 2 and 3.

By providing the functionalities of many traditional test and measurement devices, the digital test and measurement device 100 can implement these functions using a compact design. The digital test and measurement device 100 can be remotely controlled through its own user interface, for example through a computing device on an ad hoc or other wireless network, or through a wired connection. The digital test and measurement device 100 can also be controlled using Python, LabVIEW™, and MATLAB®. Settings such as scales, measurements, cursors, and input impedance can be saved in the memory 132 automatically when switching between instruments or functionalities for consistent measurements. The digital test and measurement device 100 can also save the data 134 in MAT and CSV formats, and transmit the data 134 to an Internet-connected computing device via email, Dropbox®, and iCloud®, among others.

In various embodiments, the memory 132 stores data 134 and other software or executable-code components executable by the processor 128. The data 134 can include data related to the operation of the digital test and measurement device 100, and other data. Among others, the executable-code components can include components associated with the test and measurement component 136 and/or an operating system for execution by the processor 128. Where any component discussed herein is implemented in the form of software, any one of a number of programming languages can be employed such as, for example, C, C++, C#, Objective C, JAVA®, JAVASCRIPT®, Perl, PHP, VISUAL BASIC®, PYTHON®, RUBY, FLASH®, or other programming languages.

The memory 132 stores software for execution by the processor 128. In this respect, the terms "executable" or "for execution" refer to software forms that can ultimately be run or executed by the processor 128, whether in source, object, machine, or other form. Examples of executable programs include, for example, a compiled program that can be translated into a machine code format and loaded into a random access portion of the memory 132 and executed by the processor 128, source code that can be expressed in an object code format and loaded into a random access portion of the memory 132 and executed by the processor 128, or source code that can be interpreted by another executable program to generate instructions in a random access portion of the memory 132 and executed by the processor 128, etc.

In various embodiments, the memory 132 can include both volatile and nonvolatile memory and data storage components. Volatile components are those that do not retain data values upon loss of power. Nonvolatile components are those that retain data upon a loss of power. Thus, the memory 132 can include, a random access memory (RAM), read-only memory (ROM), magnetic or other hard disk drive, solid-state, semiconductor, universal serial bus (USB)

flash drive, memory card, optical disc (e.g., compact disc (CD) or digital versatile disc (DVD)), floppy disk, magnetic tape, or any combination thereof. In addition, the RAM can include, for example, a static random access memory (SRAM), dynamic random access memory (DRAM), or magnetic random access memory (MRAM), and/or other similar memory device. The ROM can include, for example, a programmable read-only memory (PROM), erasable programmable read-only memory (EPROM), electrically erasable programmable read-only memory (EEPROM), or other similar memory device. An executable program can be stored in any portion or component of the memory 132.

The processor 128 and the test and measurement component 136 can be embodied as one or more microprocessors, one or more discrete logic circuits having logic gates for implementing various logic functions, application specific integrated circuits (ASICs) having appropriate logic gates, and/or programmable logic devices (e.g., field-programmable gate array (FPGAs), and complex programmable logic devices (CPLDs)).

If embodied in software, the test and measurement component 136 can represent a module or group of code that includes program instructions to implement the specified logical function(s) discussed herein. The program instructions can be embodied in the form of source code that includes human-readable statements written in a programming language or machine code that includes machine instructions recognizable by a suitable execution system, such as a processor in a computer system or other system. Thus, the processor 128 can be directed by execution of the program instructions to perform certain processes, such as those illustrated in the flowcharts described herein. In the context of the present disclosure, a non-transitory computer-readable medium can be any tangible medium that can contain, store, or maintain any logic, application, software, or executable-code component described herein for use by or in connection with an instruction execution system.

Also, one or more of the components described herein that include software or program instructions can be embodied in a non-transitory computer-readable medium for use by or in connection with an instruction execution system, such as the processor 128. The computer-readable medium can contain, store, and/or maintain the software or program instructions for execution by or in connection with the instruction execution system. The computer-readable medium can include a physical media, such as, magnetic, optical, semiconductor, and/or other suitable media or drives. Further, any logic or component described herein can be implemented and structured in a variety of ways. For example, one or more components described can be implemented as modules or components of a single application. Further, one or more components described herein can be executed in one computing device or by using multiple computing devices.

Figure 2:
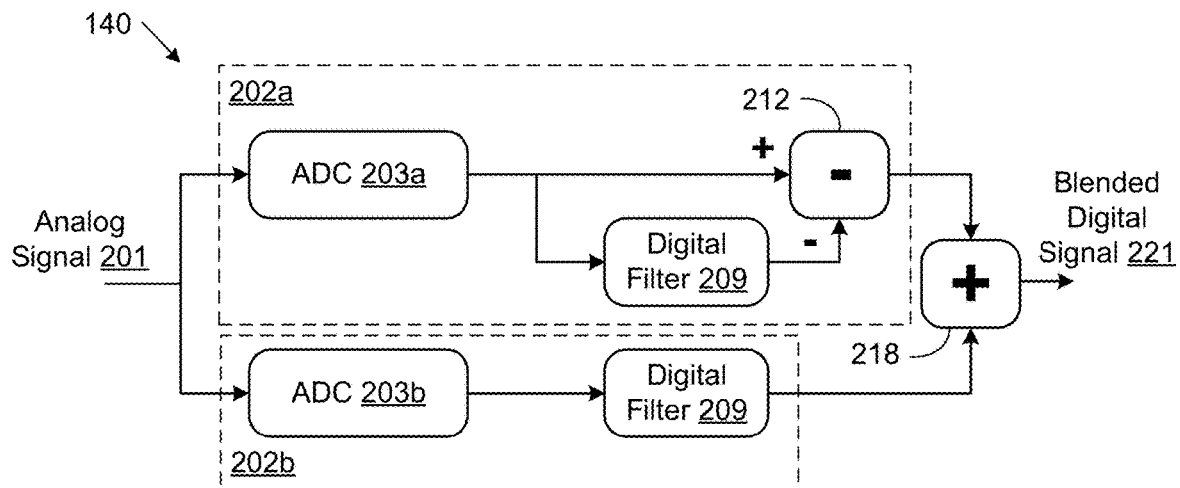
FIG. 2 is a drawing that illustrates an example of blending circuitry for blended analog-to-digital conversion for the example digital test and measurement device of FIG. 1, according to various embodiments of the present disclosure.

FIG. 2 shows an example of a blending component 140. The blending component 140 can take an analog input signal 201 that is input, for example, through an analog input 106 of the digital test and measurement device 100. The blending component 140 can simultaneously provide the analog input signal 201 to two or more frequency-domain paths such as frequency-domain path 202a and the frequency-domain path 202b. The frequency-domain path 202a and the frequency-domain path 202b can be configured or designed for different frequency ranges. Each of the frequency-domain path 202a and the frequency-domain path 202b can have high quality or fidelity for its respective frequency range. The ADC 203a can be designed for high fidelity at high frequencies that include a range of frequencies that are over a predetermined threshold frequency, while the ADC 203b can be designed for high fidelity at low frequencies that include a range of frequencies lower than the predetermined threshold frequency. The threshold frequency can be used as a corner frequency or cutoff frequency of a digital filter 209 utilized in each frequency-domain path. In this situation, the digital filter 209 can include a low pass filter. However, if the frequency-domain path 202a is designed for low frequencies, and the frequency-domain path 202b is designed for high frequencies, then the digital filter 209 can be a high pass filter The frequency-domain path 202a can include an ADC 203a, a digital filter 209, and a digital subtractor 212. The frequency-domain path 202b can include an ADC 203b, and the digital filter 209. The digital filter 209 in each path can be the same digital filter 209, or a digital filter with the same parameters. In other cases, the digital filters can be different, but can have matching cutoff frequencies and/or roll-off rates.

In the frequency-domain path 202a, the analog input signal 201 can be provided as in input to the ADC 203a. The ADC 203a can perform an analog-to-digital conversion and output a digital signal based on the analog input signal 201. The ADC 203a can be designed for high fidelity at a particular range of frequencies. As indicated above, the ADC 203a can be designed with ADC parameters that provide high fidelity at high frequencies that include a range of frequencies over a predetermined threshold frequency. ADC parameters that provide high fidelity at high frequencies include, for example, low levels of white noise, high sampling rate, low harmonic distortion.

The digital signal output from the ADC 203a can be provided to the digital subtractor 212 as well as the digital filter 209. To follow the situation where the frequency-domain path 202a is for high frequencies, the digital filter 209 can be a low pass filter. The low pass digital filter 209 can remove the frequencies higher than a cutoff frequency of the filter, outputting a filtered digital signal that includes only the frequencies (e.g., low frequencies) below the cutoff frequency.

Alternatively, if the frequency-domain path 202a is for low frequencies, the digital filter 209 can be a high pass filter. The high pass digital filter 209 can remove the frequencies lower than a cutoff frequency of the filter, outputting a filtered digital signal that includes only the frequencies (e.g., high frequencies) above the cutoff frequency.

The subtractor 212 can subtract the filtered digital signal from the digital signal that is directly output from the ADC 203a. Following the example where the frequency-domain path 202a (and the ADC 203a) is for high frequencies, then a low-pass filtered digital signal is subtracted from the digital signal that is directly output from the ADC 203a. As a result the output from the subtractor 212 will include frequencies above the cutoff frequency of the digital filter 209. If the frequency-domain path 202a (and the ADC 203a) is for low frequencies, then a high-pass filtered digital signal is subtracted from the digital signal that is directly output from the ADC 203a. The output of the subtractor 212 can be connected to a digital summation circuit or adder 218.

In the frequency-domain path 202b, the analog input signal 201 can be provided as in input to the ADC 203b. The ADC 203b can perform an analog-to-digital conversion and output a digital signal based on the analog input signal. Like the ADC 203a, the ADC 203b can also be designed for high fidelity at a particular range of frequencies. However, the ADC 203b can be designed for high fidelity at a different set of frequencies than the ADC 203a. To follow the example where the frequency-domain path 202b is for low frequencies, the ADC 203b can be designed with ADC parameters that provide high fidelity at low frequencies that include a range of frequencies under the predetermined threshold frequency. ADC parameters that provide high fidelity at low frequencies include, for example, a low 1/f (or pink) noise corner frequency, a high DC precision, high number of bits, high gain stability.

A digital signal output from the ADC 203b can be provided to the digital filter 209. To follow the situation where the frequency-domain path 202b is for low frequencies, the digital filter 209 can be a low pass filter, for example, the same low pass filter that is used for the frequency-domain path 202a, or a low pass filter that has a matching cutoff frequency and roll-off rate. The low pass digital filter 209 can remove the frequencies higher than a cutoff frequency of the filter, outputting a filtered digital signal that includes only the frequencies (e.g., low frequencies) below the cutoff frequency. Accordingly, the ADC 203b has high fidelity at low frequencies and the digital filter 209 passes these frequencies in the frequency-domain path 202b.

Alternatively, if the frequency-domain path 202b is for high frequencies, the digital filter 209 can be a high pass filter and the ADC 203b can be effective for high frequencies. The output of the digital filter 209 of the frequency-domain path 202b can be connected to the adder 218.

The adder 218 can add or sum the outputs from the frequency-domain path 202a and the frequency-domain path 202b to generate a blended digital signal 221. The frequency-domain path 202a can provide high fidelity at a frequency range that is above the predetermined frequency, while the frequency-domain path 202b can provide high fidelity at a frequency range that is below the predetermined frequency.

Using the same digital filters 209 in each path can cause the paths to be perfectly matched, resulting in unity gain over the transfer function functions where the ADCs 203a-b have the same frequency response. Similarly, matching parameters of the digital filters 209, even where the filters are not exactly the same, can help to ensure that the paths are matched, and results in substantially unity gain if the ADCs 203a-b have a substantially matching frequency response. To illustrate this, the frequency-domain path 202a can be expressed by the frequency response 1-LPF(f), whereas the frequency-domain path 202b can be expressed as LPF(f). As a result, the blended output of the adder 218 can be expressed as [1-LPF(f)]+LPF(f)=1, where LPF(f) is the low pass filter frequency response as a function of frequency f. While low pass filters are used for this example, it can also be understood that [1-HPF(f)]+HPF(f)=1, where HPF(f) is the high pass filter frequency response as a function of frequency f. The blended digital signal 221 can have high fidelity across a wider range than would be possible using a single ADC.

Figure 3:
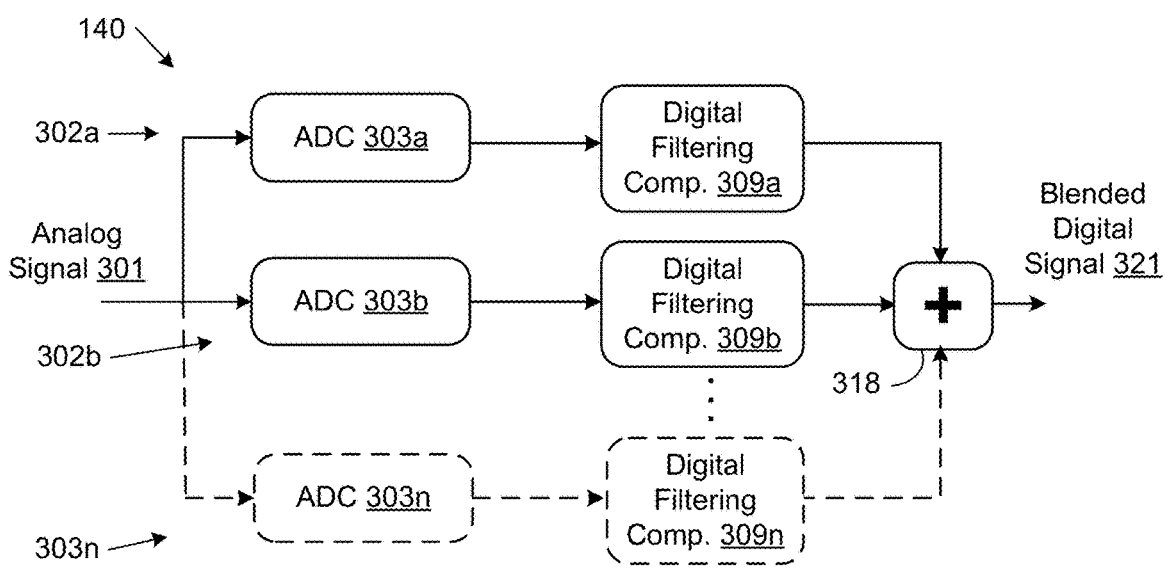
FIG. 3 is a drawing that illustrates another example of blending circuitry for blended analog-to-digital conversion for the example digital test and measurement device of FIG. 1, according to various embodiments of the present disclosure.

FIG. 3 shows another example of a blending component 140. The blending component 140 can take an analog input signal 301 that is input, for example, through an analog input 106 of the digital test and measurement device 100. The blending component 140 can simultaneously provide the analog input signal 301 to two or more frequency-domain paths such as frequency-domain paths.

Each of the frequency-domain paths 302 can be configured or designed for different frequency ranges. Each of the frequency-domain paths can have high fidelity for its respective frequency range. The ADC 303a can be designed for high fidelity at high frequencies that include a range of frequencies that are over a first predetermined threshold frequency, while the ADC 303b can be designed for high fidelity at a range of mid frequencies that include a range of frequencies lower than the first predetermined threshold frequency and higher than a second predetermined threshold frequency, and the ADC 303n can be designed for high fidelity at a range of low frequencies that include a range of frequencies lower than the second predetermined threshold frequency. As a result, the frequency-domain paths 302 can each provide high fidelity at its respective range so that the blended digital signal 321 provides optimal response across a wide range of frequencies.

The respective threshold frequencies can be used as corner frequencies or cutoff frequencies of the digital filtering components or circuits 309a, 309b . . . 309n. For example, the digital filtering component 309a can include a high pass filter that passes frequencies over the first threshold frequency. The digital filtering component 309b can include a mid-pass filter or a pair of high and low pass filters that pass a frequency range between the first and second threshold frequencies. The digital filtering component 309n can include a low pass filter that passes frequencies below the second threshold frequency. These paths can be added by the digital adder 318. In this case, the frequency responses at the blended output can be HPF(f)+MPF(f)+LPF(f) 1 based on carefully matched ADCs 303 and digital filtering components 309 in the respective frequency-domain paths 302.

Alternatively, at least one of the digital filtering components 309a, 309b . . . 309n can include a digital subtractor circuit similar to that shown in the frequency-domain path 202a of FIG. 2. For example, the digital filtering component 309a can include a high pass filter to pass a range of high frequencies, the digital filtering component 309b can include a low pass filter to pass a range of low frequencies. The digital filtering component 309c can include a subtractive circuit that passes a range of middle frequencies between the range of high frequencies and the range of low frequencies. Specifically, the digital filtering component 309c can include a high pass filter to exactly or substantially match that of the digital filtering component 309a, a low pass filter to exactly or substantially match that of the digital filtering component 309b, and at least one digital subtractor. The digital filtering component 309c can subtract a low-passed signal and a high passed signal from the digital signal output from the ADC 303n. These paths can be added by the digital adder 318. In this case, the frequency responses at the blended output can be HPF(f)+LPF(f)+[1-LPF(f)−HPF(f)]=1, because the same digital filters from digital filtering component 309a and digital filtering component 309b are used in digital filtering component 309c. The blended digital signal 221 can have high fidelity across a wider range than would be possible using a single ADC.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

Therefore, the following is claimed:

1. A reconfigurable test and measurement device for generating a blended digital signal from an analog signal, the blended digital signal having high fidelity to the analog signal over multiple frequency domains, the reconfigurable test and measurement device comprising:
   a first-frequency-domain circuit path, wherein the analog signal is input into the first-frequency-domain circuit path to generate a first processed digital signal having high fidelity to the analog signal over a first frequency domain, the first-frequency-domain circuit path comprising:
      a first analog-to-digital converter (ADC) that converts the analog signal into a first digital signal; and
      a first digital filter circuit that outputs a first filtered digital signal based on the first digital signal, wherein the first-frequency-domain circuit path outputs the first processed digital signal based at least in part on the first filtered digital signal; and
   a second-frequency-domain circuit path, wherein the analog signal is input into the second-frequency-domain circuit path to generate a second digital signal having high fidelity to the analog signal over a second frequency domain different from the first frequency domain, the second-frequency-domain circuit path comprising:
      a second ADC that converts the analog signal into a second digital signal; and
      a second digital filter circuit that outputs a second filtered digital signal based on the second digital signal, wherein the second-frequency-domain circuit path outputs the second processed digital signal based at least in part on the second filtered digital signal; and
   a digital adder circuit that adds the first processed digital signal and the second processed digital signal to generate the blended digital signal.

2. The reconfigurable test and measurement device of claim 1, wherein a sampling rate of the first ADC matches a sampling rate of the second ADC.

3. The reconfigurable test and measurement device of claim 1, wherein the first-frequency-domain circuit path further comprises: a digital subtractor circuit that subtracts the first filtered digital signal from the first digital signal to output the first processed digital signal.

4. The reconfigurable test and measurement device of claim 3, wherein the first digital filter circuit and the second digital filter circuit are matching digital low pass filters, and the first ADC is configured for high-frequency fidelity and the second ADC is configured for low-frequency fidelity.

5. The reconfigurable test and measurement device of claim 3, wherein the first digital filter circuit and the second digital filter circuit are matching digital high pass filters, and the first ADC is configured for low-frequency fidelity and the second ADC is configured for high-frequency fidelity.

6. The reconfigurable test and measurement device of claim 1, wherein the first digital filter circuit and the second digital filter circuit are configured to include a matching cutoff frequency and roll off rate.

7. The reconfigurable test and measurement device of claim 1, further comprising: a test and measurement component that processes the blended digital signal to provide an instrument-based functionality, wherein the reconfigurable test and measurement device transmits an output of the instrument-based functionality to a computing device for display.

8. A method for generating a blended digital signal from an analog signal using a digital blending circuit of a test and measurement device, the method comprising:
   generating, by a first-frequency-domain circuit path, a first processed digital signal having high fidelity to the analog signal over a first frequency domain, the first-frequency-domain circuit path comprising:
      a first analog-to-digital converter (ADC) that converts the analog signal into a first digital signal; and
      a first digital filter circuit that outputs a first filtered digital signal based on the first digital signal, wherein the first-frequency-domain circuit path outputs a first processed digital signal based at least in part on the first filtered digital signal; and
   generating, by a second-frequency-domain circuit path, a second processed digital signal having high fidelity to the analog signal over a second frequency domain different from the first frequency domain, the second-frequency-domain circuit path comprising:
      a second ADC that converts the analog signal into the second digital signal; and
      a second digital filter circuit that outputs a second filtered digital signal based on the second digital signal, wherein the second-frequency-domain circuit path outputs the second processed digital signal based at least in part on the second filtered digital signal; and
   generating a blended digital signal based at least in part on the first processed digital signal and the second processed digital signal.

9. The method of claim 8, wherein a sampling rate of the first ADC matches a sampling rate of the second ADC.

10. The method of claim 8, wherein the first-frequency-domain circuit path further comprises: a digital subtractor circuit that subtracts the first filtered digital signal from the first digital signal to output the first processed digital signal.

11. The method of claim 10, wherein the first digital filter circuit and the second digital filter circuit are matching digital low pass filters, and the first ADC is configured for high-frequency fidelity and the second ADC is configured for low-frequency fidelity.

12. The method of claim 10, wherein the first digital filter circuit and the second digital filter circuit are matching digital high pass filters, and the first ADC is configured for low-frequency fidelity and the second ADC is configured for high-frequency fidelity.

13. The method of claim 8, wherein the first digital filter circuit and the second digital filter circuit are configured to include a matching cutoff frequency and roll off rate.

14. A digital test and measurement device comprising:
   a first-frequency-domain circuit path, wherein an analog signal is input into the first-frequency-domain circuit path to generate a first processed digital signal, the first-frequency-domain circuit path comprising:
      a first analog-to-digital converter (ADC) that converts the analog signal into a first digital signal; and
      a first digital filter circuit that outputs a first filtered digital signal based on the first digital signal, wherein the first-frequency-domain circuit path outputs the first processed digital signal based at least in part on the first filtered digital signal; and
   a second-frequency-domain circuit path, wherein the analog signal is input into the second-frequency-domain circuit path to generate a second processed digital signal, the second-frequency-domain circuit path comprising:

a second ADC that converts the analog signal into a second digital signal; and a second digital filter circuit that outputs a second filtered digital signal based on the second digital signal, wherein the second-frequency-domain circuit path outputs the second processed digital signal based at least in part on the second filtered digital signal; and a digital adder circuit that adds the first processed digital signal and the second processed digital signal to generate a blended digital signal.

15. The digital test and measurement device of claim 14, wherein a sampling rate of the first ADC matches a sampling rate of the second ADC.

16. The digital test and measurement device of claim 14, wherein the first-frequency-domain circuit path further comprises: a digital subtractor circuit that subtracts the first filtered digital signal from the first digital signal to output the first processed digital signal.

17. The digital test and measurement device of claim 16, wherein the first digital filter circuit and the second digital filter circuit are matching digital low pass filters, and the first ADC is configured for high-frequency fidelity and the second ADC is configured for low-frequency fidelity.

18. The digital test and measurement device of claim 16, wherein the first digital filter circuit and the second digital filter circuit are matching digital high pass filters, and the first ADC is configured for low-frequency fidelity and the second ADC is configured for high-frequency fidelity.

19. The digital test and measurement device of claim 14, wherein the first digital filter circuit and the second digital filter circuit are configured to include a matching cutoff frequency and roll off rate.

20. The digital test and measurement device of claim 14, further comprising: a field-programmable gate array (FPGA) circuit that processes the blended digital signal to generate at least one visualization, wherein the digital test and measurement device generates a user interface comprising the at least one visualization based at least in part on the blended digital signal.

* * * * *